United States Patent [19]

Bumgardner

[11] 3,968,361

[45] July 6, 1976

[54] LASER RECEIVER ANTI-SUN CIRCUIT

[75] Inventor: Jon H. Bumgardner, Ridgecrest, Calif.

[73] Assignee: The United States of America as represented by the Secretary of the Navy, Washington, D.C.

[22] Filed: June 23, 1975

[21] Appl. No.: 589,503

[52] U.S. Cl.............................. 250/214 R; 250/199; 250/551; 307/311
[51] Int. Cl.²....................... H03F 3/08; H04B 9/00
[58] Field of Search........ 250/214 A, 214 B, 214 C, 250/214 R, 207, 551, 199; 307/311; 330/42

[56] References Cited
UNITED STATES PATENTS

| | | | |
|---|---|---|---|
| 3,576,452 | 4/1971 | Smith.................................. | 307/311 |
| 3,652,791 | 3/1972 | Shuey........................ | 250/214 AG X |
| 3,729,633 | 4/1973 | Eros et al............................ | 250/199 |
| 3,801,933 | 4/1974 | Teare.......................... | 250/214 A X |

*Primary Examiner*—Eugene La Roche
*Attorney, Agent, or Firm*—R. S. Sciascia; Roy Miller; Robert W. Adams

[57] ABSTRACT

A circuit for preventing laser receiver overload caused by sunlight wherein a feedback network provides a d.c. current to cancel the d.c. level of the diode current; and, a receiver design alternative to conventional designs wherein higher sensitivity is provided by maximizing the signal to noise ratio and processing by dual equalization to reshape the frequency response to achieve a flat response over the frequency range of interest.

5 Claims, 2 Drawing Figures

LASER RECEIVER ANTI-SUN CIRCUIT

BACKGROUND OF THE INVENTION

In the field of photodetection some applications require exposure of the devices to bright ambient condition. One such application would by any of the systems designed to receive and/or detect laser beam or pulses in the field. That is, a laser receiver subject to sunlight exposure. Heretofore, no known system has been provided that will compensate for ambient daylight in a laser receiver. Such a system would be advantageous, and in some applications would be necessary, to avoid detector saturation. If the receiver is saturated by ambient conditions a pulse of interest received during the period of saturation cannot be detected by the receiver. As a result, important information may be lost. Therefore, if the effectiveness of a laser receiver is to be improved it must include means for preventing receiver saturation from ambient conditions.

The present invention is such a system. It senses the direct current resulting from the detector's exposure to ambient conditions and generates an equal but opposite current to counteract its effect. Thereby, the system is adapted to the conditions of its environment.

Also disclosed is a dual equalization circuit as an alternate to portions of conventional receivers to provide ultra-high system sensitivity. Increased sensitivity increases efficiency in any receiver circuit and is especially beneficial when the signal to noise ratio of the input is low, as is the case with high ambient noise levels. High noise levels are present in signals received by optical receivers exposed to bright sunlight, for example.

DESCRIPTION OF THE PREFERRED EMBODIMENT

Figure 1:
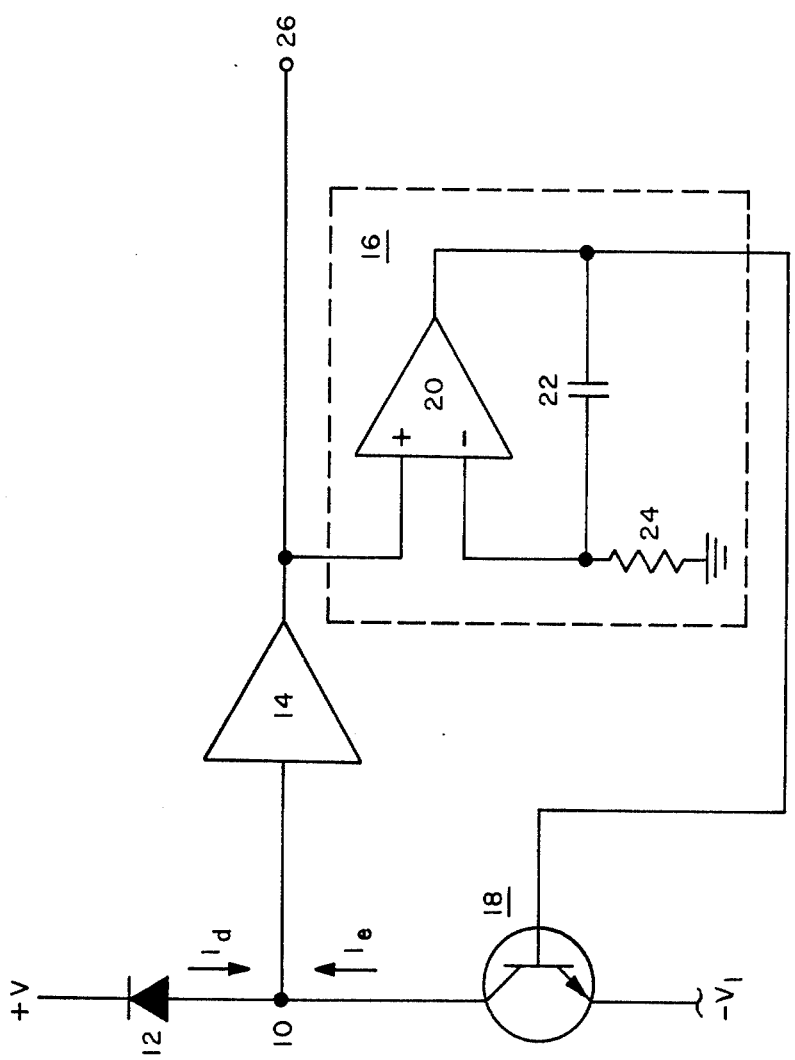
FIG. 1 is a schematic diagram of an embodiment of the present invention including a transistor as the current source.

The drawing shows a preferred embodiment of the present invention. The technique of the present inventon is to sense direct current $I_d$ resulting from ambient conditions sensed by the photodetector and cause an equal and cancelling direct current $I_e$ to flow into node 10, and thereby null the effects of current $I_d$. Photodetection diode 12 and detection amplifier 14 may be components present in such as a laser receiver. Sense circuit 16 and current source 18 are the means by which equal but opposite current $I_e$ is generated for the technique of the present invention. Sense amplifier 20 is an operational amplifier having its positive terminal coupled to the output of detection amplifier 14 and its negative terminal coupled through capacitor 22 to its own output for feedback comparison. Sensing circuit 16 senses deviations in the output of detection amplifier 14 from the desired direct current level and generates a control level output that is coupled to current source 18. The restorative current level provided by current source 18 is responsive to the output of sensing circuit 16.

Current source 18 may be a bi-polar transistor as shown in the drawing, in which case the output of sensing circuit 16 would be coupled to the base thereof as shown. It may, however, be any other current source, such as a field effect transistor (FET). Another alternative as a current source would be a photodiode wherein the output provided by sensing circuit 16 would be employed to control the output of an illumination source directed at the photodiode that would be connected in line with node 10.

Capacitor 22 and resistor 24 provide effective low frequency DC breakpoint, and establish a lower frequency of effective flat pass band of the entire FIG. 1 system frequency response.

Typical components that may be included in an operative embodiment of the present invention are operational amplifier LM308A, National, as sense amplifier 20, a 1 (one) microfarad capacitor as capacitor 22, and a 10,000 (ten thousand) ohm resistor as resistor 24. In such an embodiment current source 18 could be a 2N918 transistor.

The present invention operates as follows: A deviation in the desired (perhaps zero) output of detection amplifier 14, caused by d.c. current $I_d$ from diode 12 of the photodetector circuit in response to ambient conditions such as sunlight, is sensed by sensing circuit 16 which generates a voltage level that is coupled to current source 18. The voltage level controlling the level of current $I_e$ provided by the current source will cancel the undesired direct current level at node 10. Thereby, the detection circuit will not be saturated by ambient conditions and system output 26 will be indicative of detected pulses of interest.

Figure 2:
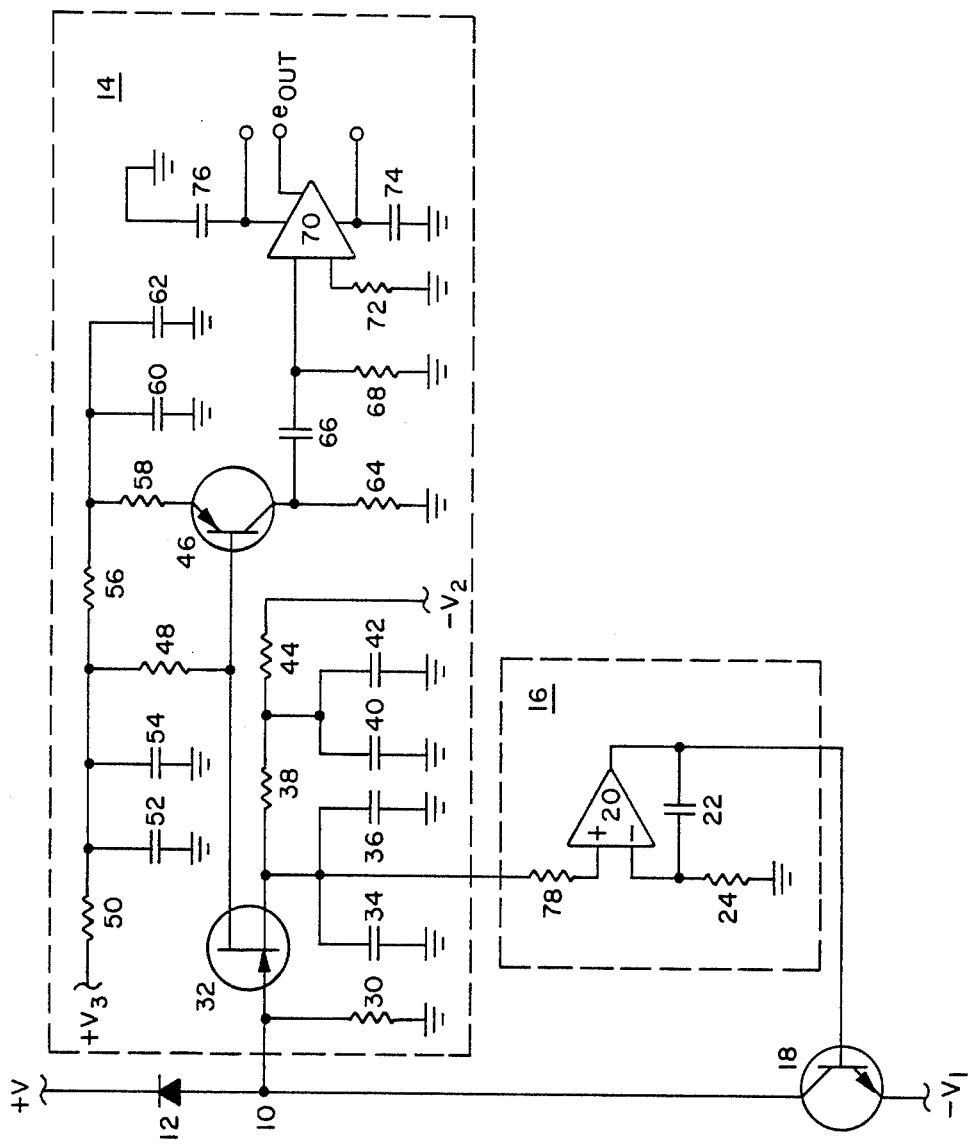
FIG. 2 is a schematic diagram of an embodiment of the present invention including receiver components specially designed to increase receiver sensitivity.

FIG. 2 shows an embodiment of the present invention including specially designed receiver circuitry for ultra-high sensitivity. Most receiver amplifiers are designed to provide a flat overall transfer function by picking a bandwidth, and then picking a photodetector resistive load $R_L$ such that $R_L = 1/C_{Shunt}W_{max}$. Optimum operation will occur, however, when system design results from the following. Since $V_{noise} = K_1 \sqrt{R_L}$ and $V_{signal} = K_2R_L$, $V^2/V_N = K_3 \sqrt{R}$.

To maximize, R is maximized. As a result, maximum realizable signal to noise ratio is achieved as conventional analysis can easily show. With this design technique no direct attempt is made to achieve a flat frequency response at the photo diode output terminals. Instead, input equalization is made to maximize the signal to noise power ratio regardless of the effect on frequency response. After the initial gain is achieved, the signal is processed by the second equalizing circuit to flatten the frequency response over the range of interest. FIG. 2 shows an embodiment of the technique wherein equalization is provided for amplifier 14 and the input photo diode response.

In the embodiment of FIG. 2, current optically induced in photodiode 12 flows to negative source $- V_1$ through constant current transistor 18. Since the output impedance of transistor 18 is extremely high, the input time constant will typically be so long (due to total input shunt capacitance to ground) that the effective diode response will be falling at −6db per octave throughout the entire frequency band used. This will result, however, in the maximum signal to noise power ratio possible. Frequency flattening will be taken care of in a later stage.

The dynamic path of the signal is from the drain of amplifier 32 to the base and collector of amplifier 46. Then, through the high pass filter composed of resistors 64 and 68, and capacitor 66. The stray capacitance around the filter determines the maximum value of resistors 64 and 68. Namely, they are chosen such that the +6db per octave gain of the high pass circuit begins to diminish at the upper operating frequency required of the system. Amplifier 70 then amplifies the signal further and provides output isolation from the equalization network.

The two networks have a net frequency deviation of 0db per decade until the high pass filter begins to fall from its +6db per octave rise. Capacitors 40 and 42, and resistor 44 furnish power supply decoupling. Capacitors 34 and 36, and resistor 38 furnish further decoupling and a low AC impedance to ground for the source terminal of amplifier 32. Resistor 78 and its shunt capacitance provides low pass filtering of the source output voltage of transistor 32.

In this configuration the transistor 32 source will follow the gate voltage with a given offset, except that high frequency components will be dropped across amplifier 32. Any deviation of the source voltage of amplifier 32 from 0 (zero) volts will cause integration current to flow in resistor 24 and displacement current in capacitor 22 due to amplifier 20. This will cause negative feedback through transistor 18 and cause the source voltage of amplifier 32 to average 0 (zero) volts. Thus, the average current of diode 12 will flow through transistor 18 and not saturate amplifier 32, as would normally be the case with a strongly sunlit background, or the like, and conventional resistive load.

Source $-V_2$, and resistors 38 and 44 determine the average current of amplifier 32. Resistor 50 and capacitors 52 and 54, and resistor 56 and capacitors 60 and 62 provide power decoupling. Resistor 48 provides load resistance to amplifier 32. Resistor 58 in conjunction with transistor 46, capacitor 66 and resistors 64 and 68 establish the second stage gain. Resistor 72 provides a balanced source resistance to ground, and capacitors 74 and 76 provide power decoupling, for amplifier 70.

The system's lower −3db frequency is usually determined by the values of capacitor 22 and resistor 24, and the gain of transistor 18 since the time constant of input node 10 is much lower in frequency than the so determined value. At high frequencies, sensing circuit 16 and current source 18 have virtually no effect on system signal gain. But, at the low frequency cutoff point circuit 16 and transistor 18 have a composite gain of unity, the system signal gain drops to −3db of the flat passband gain, and gain decreases 6db lower for every octave lower in frequency below cutoff frequency until node 10 breakpoint is reached. Then, low frequency rolloff changes to 12db per octave.

Implementation of the above technique may be accomplished by utilizing the following components in the exemplary circuit of FIG. 2. It should be noted that the present invention can be practiced by other designs employing the techniques disclosed herein, and that all of them are considered to be part of the present invention.

| Symbol | Component | Type or Value |
|---|---|---|
| 12 | Photodiode | PIN5D |
| 20 | Operational Amplifier | μA741 |
| 30 | Resistor | 402Ω metal film (MF) |
| 32 | Field Effect Transistor | 2N4416 |
| 34 | Capacitor | 0.1μf ceramic |
| 36 | Capacitor | 20μf |
| 38 | Resistor | 2670Ω MF |
| 40 | Capacitor | 0.1μf ceramic |

-continued

| Symbol | Component | Type or Value |
|---|---|---|
| 42 | Capacitor | 68/20 μf |
| 44 | Resistor | 100Ω |
| 46 | Transistor | 2N4457 |
| 48 | Resistor | 301Ω MF |
| 50 | Resistor | 100Ω |
| 52 | Capacitor | 0.1μf ceramic |
| 54 | Capacitor | 68/20 μf |
| 56 | Resistor | 150Ω MF |
| 58 | Resistor | 32Ω MF |
| 60 | Capacitor | 0.1μf ceramic |
| 62 | Capacitor | 20μf |
| 64 | Resistor | 402Ω MF |
| 66 | Capacitor | 10pf silver mica |
| 68 | Resistor | 402Ω MF |
| 70 | Operational Amplifier | μA733 |
| 72 | Resistor | 402ΩMF |
| 74 | Capacitor | 0.1μf ceramic |
| 76 | Capacitor | 0.1μf ceramic |
| V,$V_1$ | Voltage Supply | 50 volts |
| $V_2$ | Voltage Supply | 15 volts |
| $V_3$ | Voltage Supply | 15 volts |

To those skilled in the art it will be obvious upon a study of this disclosure that the present invention permits a variety of modifications in structure and arrangement and hence can be given embodiments other then particularly illustrated and described herein, without departing from the essential features of the invention within the scope of the claims annexed hereto.

What is claimed is:

1. An electronic circuit includable within a photodetector circuit to eliminate the effects of background illumination so that detection of the illumination-of-interest is improved, comprising:
    said photodetector circuit including a photodetector;
    ambient illumination within the field of detection of said photodetector;
    circuit means coupled to said photodetector circuit for eliminating the effects of said ambient illumination in the output of said photodetector by providing a compensating electrical current that is combined with said output of the photodetector;
    wherein said photodetector circuit has first and second stages, with said first stage having the gate of a field effect transistor coupled to said photodetector, and wherein said circuit means includes an operational amplifier having negative feedback, coupled to said photodetector circuit for receiving an output from the source of said field effect transistor, and a current source means coupled to the output of said operational amplifier for controlling said compensating current in response to the output of said operational amplifier.

2. The circuit of claim 1 wherein said current source means includes a voltage source and a transistor wherein the first terminal of said transistor is the base of said transistor and is coupled to the output of said operational amplifier, the second terminal of said transistor is coupled to said voltage source, and the third terminal is coupled to the output of said photodetector.

3. The circuit of claim 1 wherein said current source means includes a voltage source, and an electro-optical current control circuit coupled to the output of said operational amplifier.

4. The circuit of claim 1 wherein said operational amplifier is a sensing amplifier that compares its inputs and provides a difference value output wherein said amplifier has a non-inverting input terminal and an inverting input terminal and said non-inverting input terminal is coupled to the source of said field effect transistor and said inverting input terminal is coupled through a capacitor to the output of said operational amplifier and through a resistor to circuit common ground, such that said sensing amplifier senses deviations in the output of the source of said field effect transistor from the amplifier's reference feedback input.

5. The circuit of claim 4 wherein said first stage of said photodetector circuit is equalized for maximum signal to noise ratio, and wherein said field effect transistor has its gate coupled to said compensated output of said photodetector, and its drain coupled to said second stage; and said second stage is equalized for flat system response and includes a transistor having first, second, and third terminals, wherein said first terminal is the base of said transistor and is coupled to said drain of said first stage, said second terminal is coupled to a power supply, and said third terminal is coupled to the system output terminal of said laser receiver.

* * * * *